US009147572B2

(12) United States Patent
Jha et al.

(10) Patent No.: US 9,147,572 B2
(45) Date of Patent: Sep. 29, 2015

(54) USING SACRIFICIAL OXIDE LAYER FOR GATE LENGTH TUNING AND RESULTING DEVICE

(71) Applicant: GLOBALFOUNDRIES Inc., Grand Cayman (KY)

(72) Inventors: Ashish Kumar Jha, Clifton Park, NY (US); Haiting Wang, Clifton Park, NY (US); Meng Luo, Clifton Park, NY (US); Yong Meng Lee, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 2 days.

(21) Appl. No.: 13/896,022

(22) Filed: May 16, 2013

(65) Prior Publication Data

US 2014/0339612 A1    Nov. 20, 2014

(51) Int. Cl.
*H01L 21/8234* (2006.01)
*H01L 21/02* (2006.01)
*H01L 21/28* (2006.01)
*H01L 29/66* (2006.01)
*H01L 21/311* (2006.01)

(52) U.S. Cl.
CPC .... *H01L 21/02071* (2013.01); *H01L 21/28238* (2013.01); *H01L 21/31144* (2013.01); *H01L 21/823456* (2013.01); *H01L 21/823481* (2013.01); *H01L 29/6653* (2013.01); *H01L 29/6656* (2013.01); *H01L 29/66545* (2013.01); *H01L 29/66553* (2013.01)

(58) Field of Classification Search
CPC ............... H01L 29/66477; H01L 29/66545; H01L 29/66553; H01L 29/6656; H01L 29/66674; H01L 29/66606
See application file for complete search history.

(56) References Cited

U.S. PATENT DOCUMENTS

2006/0148243 A1\* 7/2006 Wang .............................. 438/638
2013/0062702 A1\* 3/2013 Cheng et al. .................. 257/369

\* cited by examiner

*Primary Examiner* — Su C Kim
(74) *Attorney, Agent, or Firm* — Ditthavong & Steiner, P.C.

(57) ABSTRACT

Methods for controlling the length of a replacement metal gate to a designed target gate length and the resulting device are disclosed. Embodiments may include removing a dummy gate from above a substrate forming a cavity, wherein side surfaces of the cavity are lined with an oxidized spacer layer and a bottom surface of the cavity is lined with a gate oxide layer, conformally forming a sacrificial oxide layer over the substrate and the cavity, and removing the sacrificial oxide layer from the bottom surface of the cavity and the substrate leaving sacrificial oxide spacers lining the side surfaces of the cavity.

12 Claims, 5 Drawing Sheets

USING SACRIFICIAL OXIDE LAYER FOR GATE LENGTH TUNING AND RESULTING DEVICE

TECHNICAL FIELD

The present disclosure relates to forming replacement metal gates in semiconductor devices. The present disclosure is particularly applicable to forming replacement metal gates for 20 nanometer (nm) technology nodes and beyond.

BACKGROUND

During the formation of replacement metal gates in the manufacture of semiconductor devices, the gate length of a cavity formed by the removal of a dummy gate may increase as a result of processing steps prior to formation of the replacement metal gate. For example, during removal of a gate oxide layer from the bottom surface of the cavity above a substrate layer, an oxidized spacer layer formed as a spacer surrounding the dummy gate and defining sides of the cavity may also be at least partially removed, thereby increasing the gate length of the cavity as compared to a designed target. By way of another example, during a high-k metal pre-cleaning, additional oxidized spacer layer may be removed further increasing the gate length. Depending on the process conditions, 3 to 4 nm of the oxide spacer layer may be removed during each one of the above two steps. Accordingly, the gate length may increase from 6 to 8 nm beyond the designed target. The increase in the gate length can impact other semiconductor device parameters. For example, the increased gate length may degrade the yield by increasing trench silicide to polysilicon gate shorts.

A need therefore exists for controlling the gate length of a replacement metal gate to a designed target, and the resulting device.

SUMMARY

An aspect of the present disclosure is a method providing for tuning of the gate length of a replacement metal gate by a reactive-ion etch of a sacrificial oxide layer.

Another aspect of the present disclosure is semiconductor device with a replacement metal gate length within 6 nm of a designed target as a result of reactive-ion etching of a sacrificial oxide layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: removing a dummy gate from above a substrate forming a cavity, wherein side surfaces of the cavity are lined with an oxidized spacer layer and a bottom surface of the cavity is lined with a gate oxide layer; conformally forming a sacrificial oxide layer over the substrate and the cavity; and removing the sacrificial oxide layer from the bottom surface of the cavity and the substrate via a reactive-ion etching leaving sacrificial oxide spacers lining the side surfaces of the cavity.

An aspect of the present disclosure includes performing the reactive-ion etching for 8 to 20 seconds. An additional aspect includes removing the gate oxide layer at the bottom of the cavity, exposing the substrate, and forming a high-k metal gate within the cavity. Yet another aspect includes, prior to forming the high-k metal gate, a gate length having increased less than 6 nm. Yet another aspect includes, after removal of the gate oxide layer, performing an in-situ dry chemical cleaning of the cavity and the substrate, with the in-situ dry chemical cleaning increasing a gate length less than 3 nm. Still another aspect includes, after the in-situ dry chemical cleaning, performing a high-k pre-cleaning of the cavity and the substrate, with the high-k pre-cleaning increasing the gate length less than 3 nm. A further aspect includes tuning removal of any of the oxidized spacer layer that increases the gate length based on the thickness of the sacrificial oxide layer. Another aspect includes forming the sacrificial oxide layer to a thickness of 20 to 80 Angstroms (Å). An additional aspect includes controlling the gate length prior to forming the high-k metal gate based on a thickness of the sacrificial oxide layer. Still another aspect includes annealing the sacrificial oxide layer after conformally forming the sacrificial oxide layer over the substrate and the cavity. Further aspects include removing one or more additional dummy gates from above the substrate forming one or more additional cavities, wherein the sacrificial oxide layer is conformally formed over the substrate, the cavity, and the one or more additional cavities, and forming a mask over the substrate and the one or more additional cavities, exposing the sacrificial oxide layer over the cavity. Still another aspect includes removing the mask after performing an in-situ dry chemical cleaning.

Another aspect of the present disclosure is a device including: a substrate; a high-k metal gate above the substrate; and a pair of spacers on opposite sides of the high-k metal gate, the pair of spacers being formed of a vertical oxide layer contiguous to side edges of the high-k metal gate and a vertical nitride layer surrounding the vertical oxide layer.

Aspects include a gate length of the high-k metal gate being tuned by a reactive-ion etching of a sacrificial oxide layer. Another aspect includes the high-k metal gate being contiguous with the substrate. Still another aspect includes a thickness of the vertical oxidized nitride layer being 10 to 40 Å.

Another aspect of the present disclosure includes a method including: removing a dummy gate from above a substrate forming a cavity, wherein side surfaces of the cavity are lined with an oxidized spacer layer and a bottom surface of the cavity is lined with a gate oxide layer; conformally forming a sacrificial oxide layer over the substrate and the cavity to a thickness of 20 to 80 Å; removing the sacrificial oxide layer from the bottom surface of the cavity leaving sacrificial oxide spacers lining the side surfaces of the cavity; removing the gate oxide layer from the bottom of the cavity by an in-situ dry chemical cleaning; and performing a high-k pre-cleaning of the cavity and the substrate, wherein the thickness of the sacrificial oxide layer is tuned based on protecting the oxidized spacer layer during the in-situ dry chemical cleaning and the high-k pre-cleaning.

An aspect of the present disclosure includes the in-situ dry chemical cleaning increasing a gate length of the cavity less than 3 nm. Another aspect includes the high-k pre-cleaning increasing a gate length of the cavity less than 3 nm. A further aspect includes forming a high-k metal gate within the cavity.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure.

Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of replacement metal gates being formed longer than designed target dimensions attendant upon replacement metal gate processing schemes. In accordance with embodiments of the present disclosure, a sacrificial oxide layer is conformally formed over a cavity prior to forming the replacement metal gate for tuning a length of the replacement metal gate.

Methodology in accordance with an embodiment of the present disclosure includes removing a dummy gate from above a substrate forming a cavity. The cavity includes side surfaces that are lined with an oxidized spacer layer and a bottom surface that is lined with a gate oxide layer. Next, a sacrificial oxide layer is conformally formed over the substrate and the cavity. Then, the sacrificial oxide layer is removed from the bottom surface of the cavity and the substrate via a reactive-ion etching leaving sacrificial oxide spacers lining the side surfaces of the cavity. The remaining sacrificial oxide spacers protect the oxidized spacer layers from being removed during subsequent processing, thereby controlling the length of the subsequently formed high-k metal gate.

Figure 1:
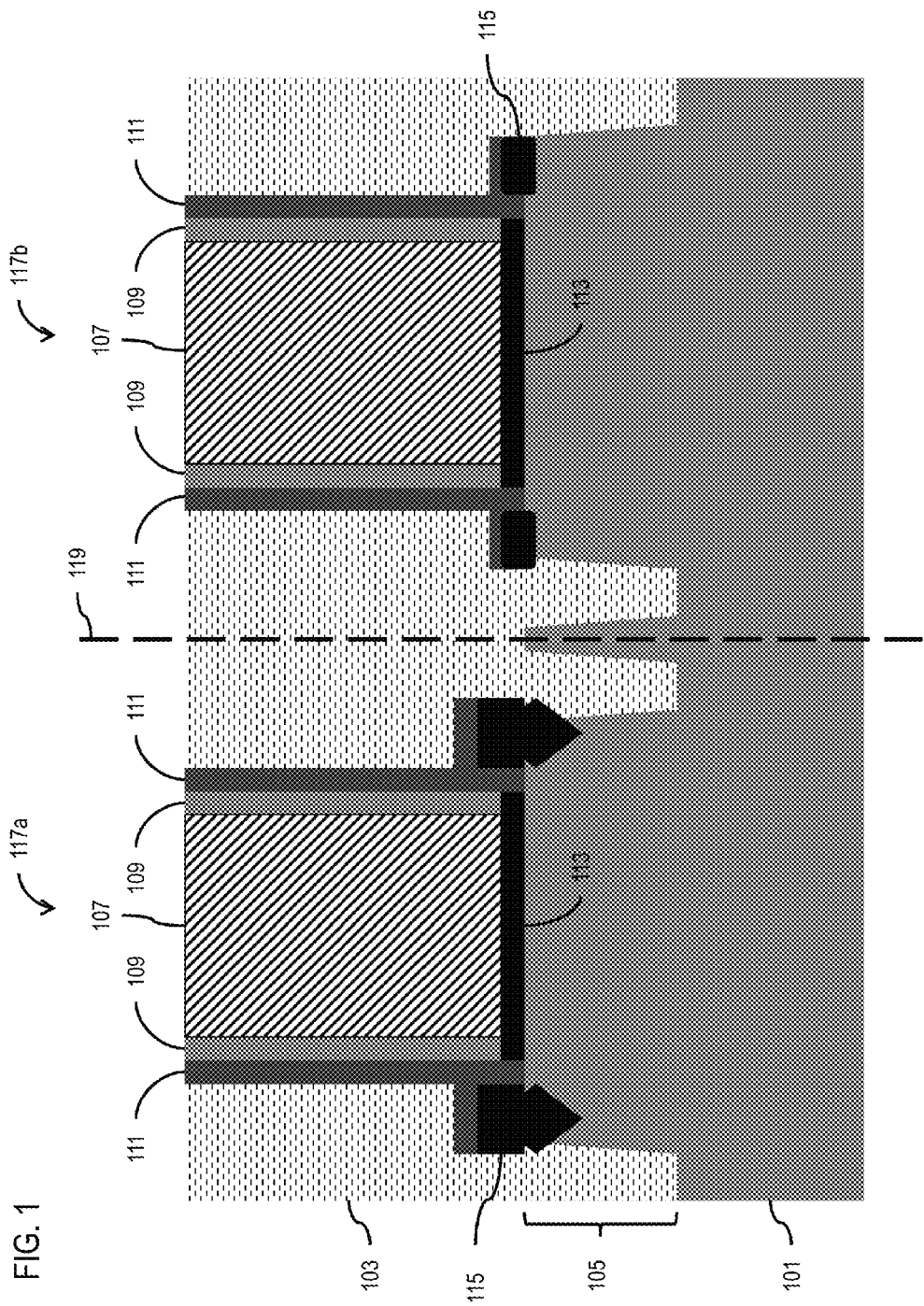
FIGS. 1 through 5 schematically illustrate a method for forming a replacement metal gate within a designed target length, in accordance with an exemplary embodiment.

Adverting to FIG. 1, a method for forming a replacement metal gate within a designed target length, according to an exemplary embodiment, begins with a substrate 101. The substrate 101 may be formed of bulk silicon (Si) or a silicon-on-insulator (SOI) substrate. Above the substrate 101 is an interlayer dielectric (ILD) 103 that includes shallow trench isolation (STI) regions 105 buried within the substrate 101. Within the ILD 103 are dummy gates 107. The dummy gates 107 may be formed of poly-silicon (poly-Si). Surrounding the dummy gates 107 are an oxidized spacer layer 109, which may be formed from oxidation of a nitride spacer. Further, surrounding the oxidized spacer layer 109 is a nitride spacer layer 111, which may be formed of silicon nitride (SiN). The oxidized spacer layer 109 and the nitride spacer layer 111 together form spacers for the dummy gates 107 (and eventually, as described below, for the high-k metal gates). Below the dummy gates 107 is a gate oxide layer 113, which may be formed of any oxide, such as $SiO_2$. On either side of the nitride spacer layer 111 are source/drain regions 115. The two illustrated dummy gates 107, in addition to the oxidized spacer layer 109, the nitride spacer layer 111, the gate oxide layer 113 and the source/drain regions 115 may be precursors for forming a P-type field-effect transistor (PFET) (e.g., 117a) and an N-type field-effect transistor (NFET) (e.g., 117b). Although illustrated as being next to each other, there may be a smaller or larger gap between the PFET 117a and NFET 117b as indicated by the dashed line 119. Also, although not shown (for illustrative convenience), there may be more than two dummy gates 107 formed above the substrate 101. Further, the characteristics or properties of the dummy gates 107 may differ, such as some dummy gates 107 may be for forming input/output devices and may be larger than other dummy gates 107 that are for forming core devices.

Figure 2:
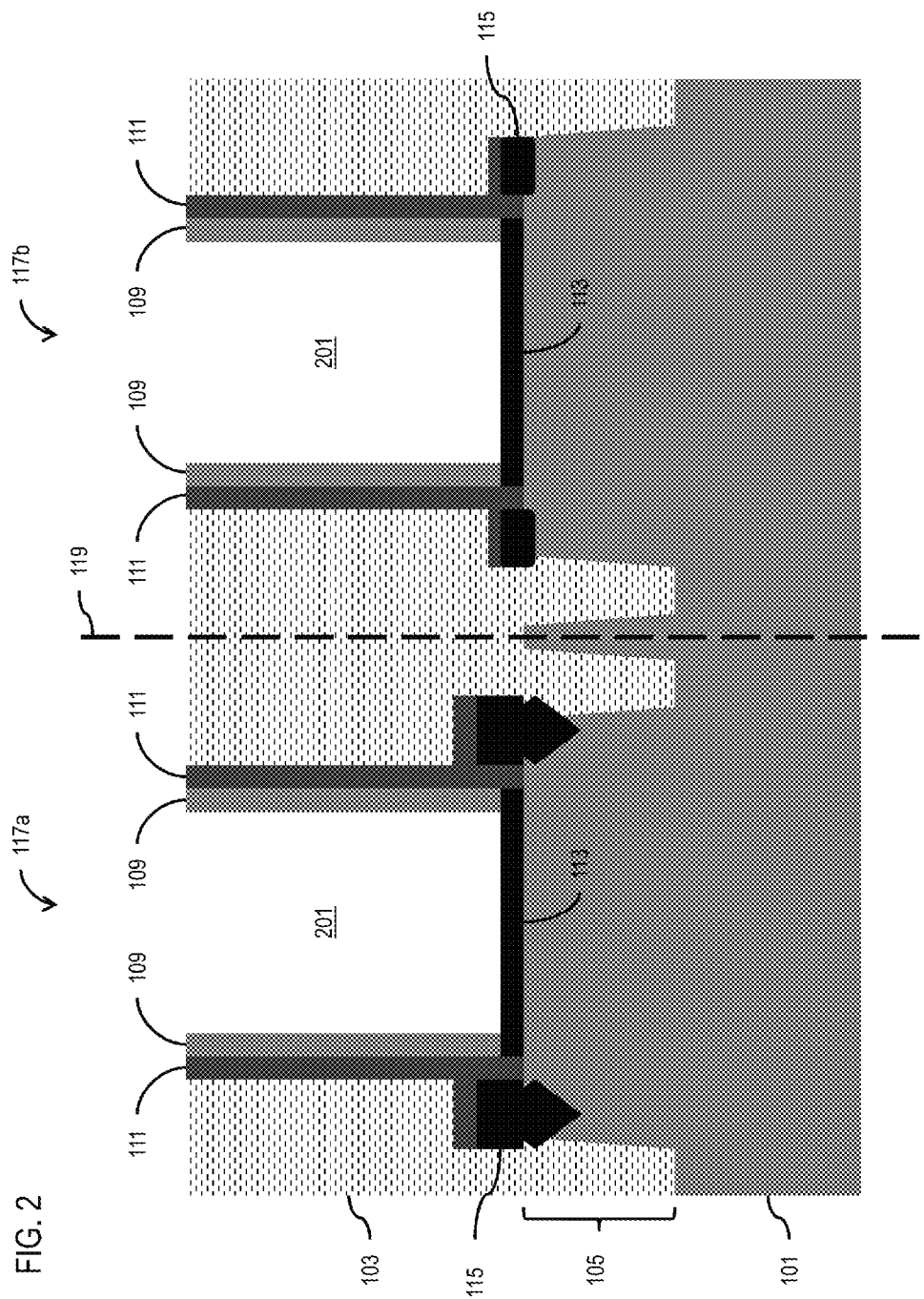

Adverting to FIG. 2, the dummy gates 107 are removed. The dummy gates 107 may be removed by any conventional processing step, such as by wet chemical etching. By removing the dummy gates 107, cavities 201 are formed, with side surfaces of the cavities 201 being defined by the oxidized spacer layer 109 and a bottom surface of the cavities 201 being defined by the gate oxide layer 113.

Figure 3:
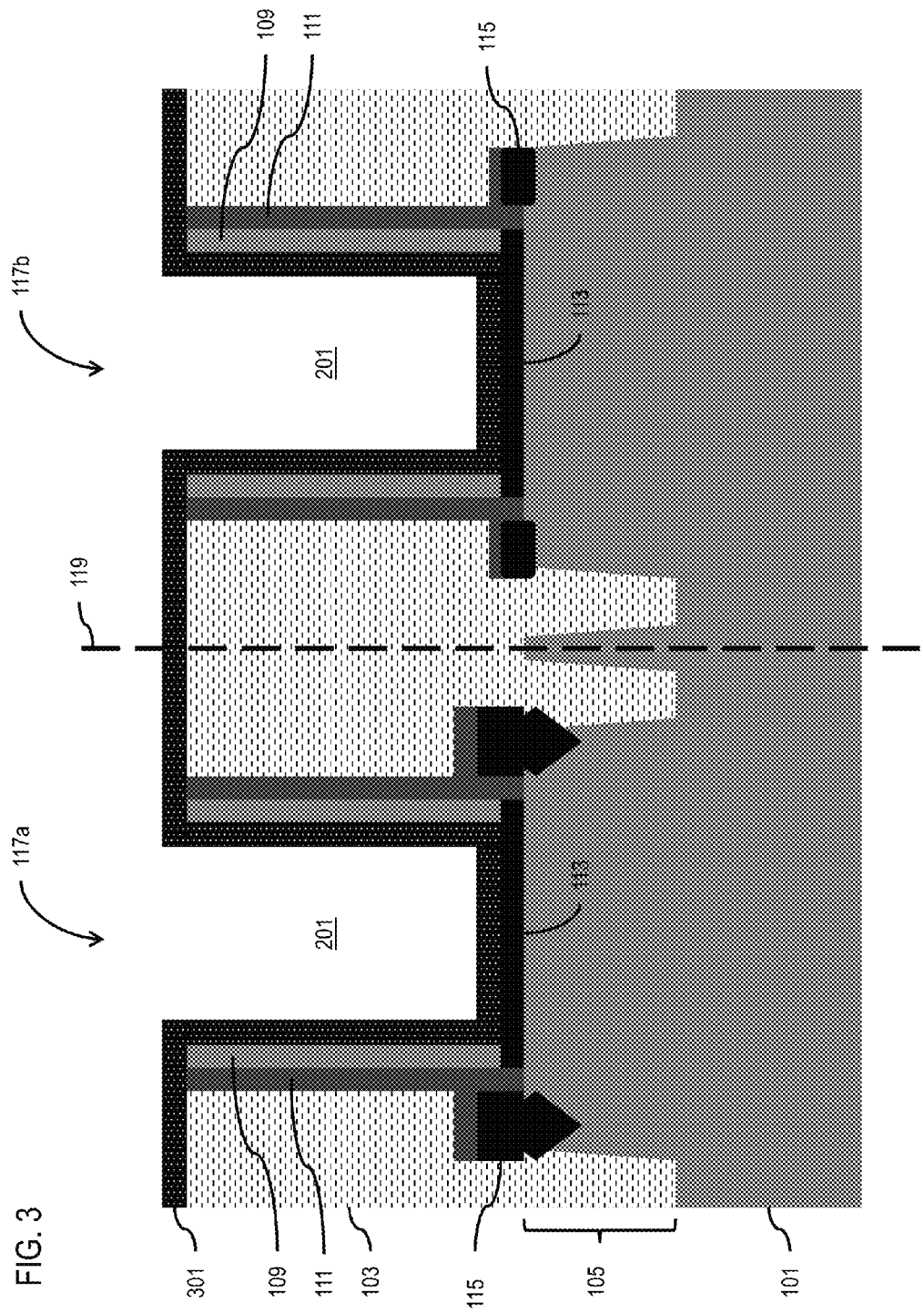

Next, a sacrificial oxide layer 301 is formed over the ILD 103 and the cavities 201, as illustrated in FIG. 3. As illustrated, the sacrificial oxide layer 301 may be conformally deposited over the cavities 201. The sacrificial oxide layer 301 may be formed of any oxide, such as CVD oxide and/or the gate oxide layer 113, and may be formed to a thickness of 20 to 80 Å. Further, after forming the sacrificial oxide layer 301, the layer 301 may be annealed. The sacrificial oxide layer 301 may be further masked (not shown for illustrative convenience) exposing the sacrificial oxide layer 301 over only the cavities 201 associated with forming the core devices.

Figure 4:
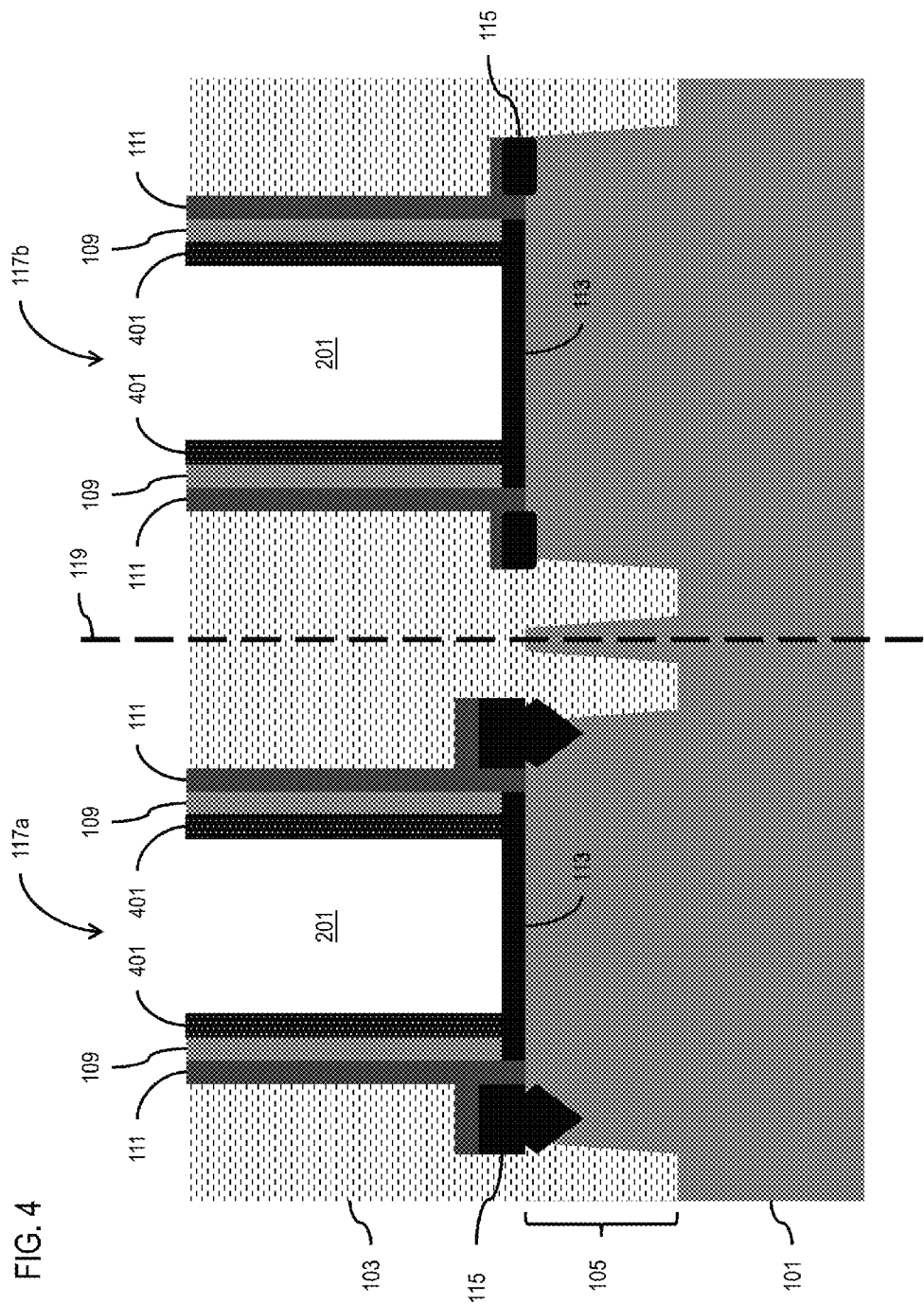

Adverting to FIG. 4, with the cavities 201 exposed, the horizontal portions of the sacrificial oxide layer 301 are removed from the ILD 103 and the gate oxide layer 113 by a reactive-ion etching leaving sacrificial oxide spacers 401. By using a reactive-ion etching rather than a wet chemical etching, the amount of the sacrificial oxide spacers 401 that are removed can be tuned to prevent increasing the gate length of the cavities 201 beyond a designed target, both during the reactive-ion etching and during subsequent processing steps for preparing the structure for the high-k metal gates. Thus, the sacrificial oxide spacers 401 also seal and protect the oxidized spacer layer 109 from being removed during subsequent processing steps.

Figure 5:
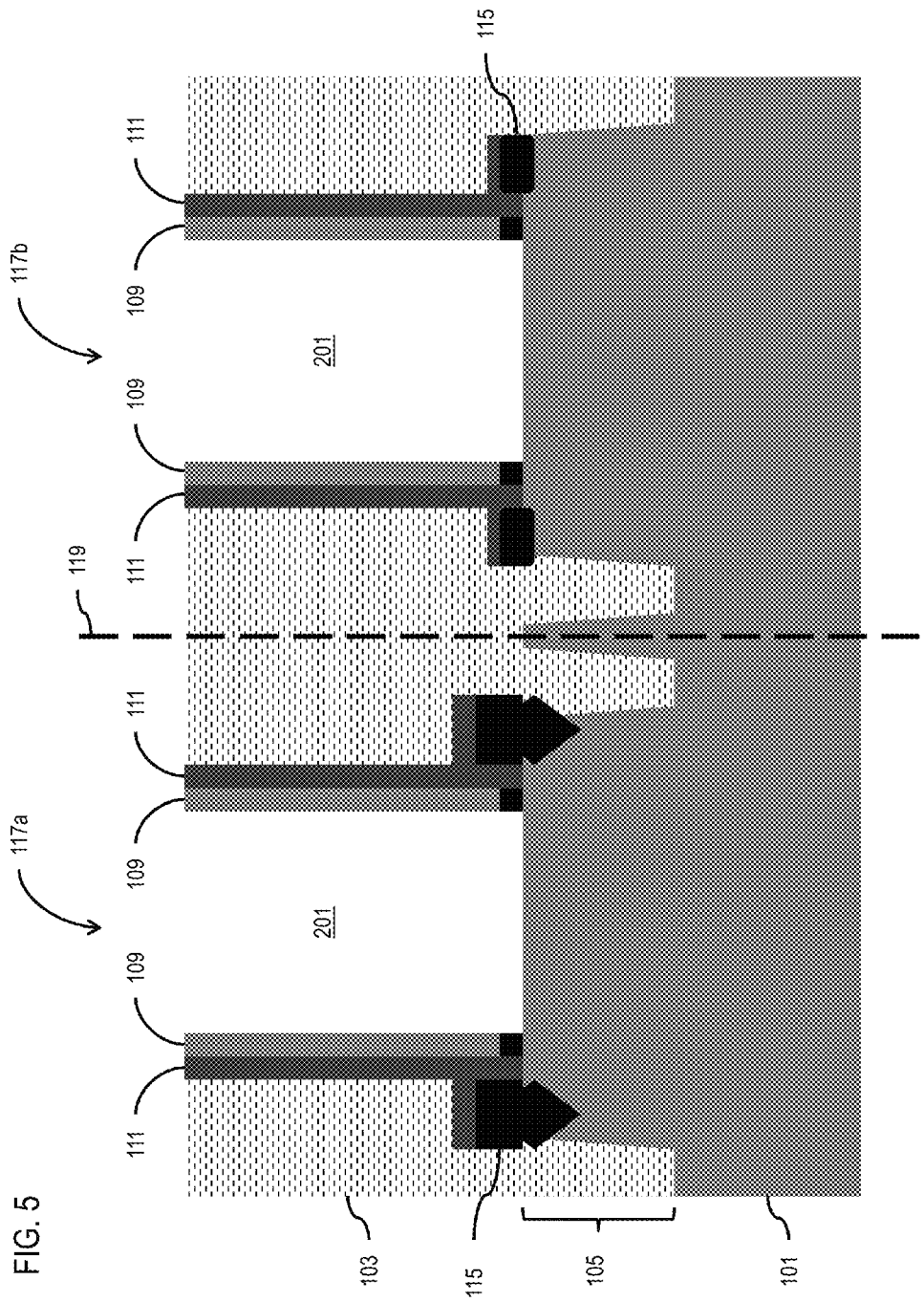

As illustrated in FIG. 5, after forming the sacrificial oxide spacers 401, and thereby exposing the gate oxide layer 113, the gate oxide layer 113 is removed by an in-situ dry chemical process (e.g., SICONI®). The thickness of the sacrificial oxide layer 301, and thereby the sacrificial oxide spacers 401, can be tuned such that the in-situ dry chemical process increases the gate length of the cavities 201 no more than 3 nm during removal of the gate oxide layer 113. After additional processing, such as removing the mask and performing a high-k pre-cleaning, the sacrificial oxide spacers 401 further limit the cavities 201 from increasing the gate length to no more than 3 nm from the gate length after the in-situ dry chemical process, or no more than 6 nm overall. As illustrated in FIG. 5, the thickness of the sacrificial oxide spacers 401 may be tuned such that, after the above-described processing, the sacrificial oxide spacers 401 are removed without removing any of the oxidized spacer layer 109 to prevent enlarging the gate length of the cavities 201 beyond a designed target dimension. Thus, the thickness of the sacrificial oxide spacers

401 may be tuned such that the oxidized spacer layer 109 is 1 to 7 nm thick after the above-described processing, which may be more than 100% of the original thickness of the oxide spacer layer 109. Additional processing may then occur (not shown for illustrative convenience) to form the high-k metal gates.

The embodiments of the present disclosure achieve several technical effects, such as manufacturing replacement metal gates within a designed target without requiring a substantial change in a replacement metal gate process scheme. Embodiments of the current disclosure also achieve the ability to tune the length of the replacement metal gate without affecting an embedded silicon-germanium (eSiGe) layer (particularly for the PFET source/drain), raised source/drains (particularly for the NFET source/drain), spacers, implants and the high-k metal gate process scheme. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   removing a dummy gate from above a substrate forming a cavity, wherein side surfaces of the cavity are lined with an oxidized spacer layer and a bottom surface of the cavity is lined with a gate oxide layer;
   conformally forming a sacrificial oxide layer over the substrate and the cavity;
   removing the sacrificial oxide layer from the bottom surface of the cavity and the substrate via a reactive-ion etching for 8 to 20 seconds leaving sacrificial oxide spacers lining the side surfaces of the cavity;
   removing the gate oxide layer at the bottom of the cavity, exposing the substrate, and forming a high-k metal gate within the cavity;
   after removal of the gate oxide layer, performing an in-situ dry chemical cleaning of the cavity and the substrate,
   wherein the in-situ dry chemical cleaning increases a gate length of the cavity less than 3 nm.

2. The method according to claim 1, further comprising, after the in-situ dry chemical cleaning:
   performing a high-k pre-cleaning of the cavity and the substrate,
   wherein the high-k pre-cleaning increases the gate length of the cavity less than 3 nm.

3. The method according to claim 2, further comprising:
   tuning removal of any of the oxidized spacer layer that increases the gate length based on the thickness of the sacrificial oxide layer.

4. The method according to claim 1, comprising:
   forming the sacrificial oxide layer to a thickness of 20 to 80 Angstroms (Å).

5. The method according to claim 1, comprising:
   controlling the gate length of the cavity prior to forming the high-k metal gate based on a thickness of the sacrificial oxide layer.

6. The method according to claim 1, further comprising:
   annealing the sacrificial oxide layer after conformally forming the sacrificial oxide layer over the substrate and the cavity.

7. The method of claim 1, further comprising:
   removing one or more additional dummy gates from above the substrate forming one or more additional cavities, wherein the sacrificial oxide layer is conformally formed over the substrate, the cavity, and the one or more additional cavities; and
   forming a mask over the substrate and the one or more additional cavities, exposing the sacrificial oxide layer over the cavity.

8. The method of claim 1, further comprising:
   removing the mask after performing an in-situ dry chemical cleaning.

9. A method comprising:
   removing a dummy gate from above a substrate forming a cavity, wherein side surfaces of the cavity are lined with an oxidized spacer layer and a bottom surface of the cavity is lined with a gate oxide layer;
   conformally forming a sacrificial oxide layer over the substrate and the cavity to a thickness of 20 to 80 Angstroms (Å);
   removing the sacrificial oxide layer from the bottom surface of the cavity leaving sacrificial oxide spacers lining the side surfaces of the cavity;
   removing the gate oxide layer from the bottom of the cavity by an in-situ dry chemical cleaning; and
   performing a high-k pre-cleaning of the cavity and the substrate,
   wherein the thickness of the sacrificial oxide layer is tuned based on protecting the oxidized spacer layer during the in-situ dry chemical cleaning and the high-k pre-cleaning.

10. The method according to claim 9, wherein the in-situ dry chemical cleaning increases a gate length of the cavity 3 to 4 nm.

11. The method according to claim 9, wherein the high-k pre-cleaning increases a gate length of the cavity 3 to 4 nm.

12. The method according to claim 9, further comprising:
    forming a high-k metal gate within the cavity.

* * * * *